United States Patent [19]

Kim

[11] Patent Number: 5,985,125
[45] Date of Patent: Nov. 16, 1999

[54] SELECTIVE COPPER DEPOSITION METHOD

[75] Inventor: Jae-Jeong Kim, Choongchungbook-Do, Rep. of Korea

[73] Assignee: LG Semicon Co., Ltd., Cheongju, Rep. of Korea

[21] Appl. No.: 08/887,652

[22] Filed: Jul. 3, 1997

Related U.S. Application Data

[63] Continuation of application No. 08/583,892, Jan. 11, 1996, abandoned.

[30] Foreign Application Priority Data

Jul. 24, 1995 [KR] Rep. of Korea ............... 95-21856

[51] Int. Cl.$^6$ ..................................................... C25D 5/02
[52] U.S. Cl. ......................... 205/123; 205/184; 205/194; 204/231
[58] Field of Search .................. 205/118, 123, 205/184, 194; 204/231

[56] References Cited

U.S. PATENT DOCUMENTS

| | | |
|---|---|---|
| 3,696,017 | 10/1972 | Wallen ............................. 204/231 |
| 4,065,374 | 12/1977 | Asami et al. ..................... 204/231 |
| 4,169,018 | 9/1979 | Berdan et al. ..................... 205/50 |
| 5,225,034 | 7/1993 | Yu et al. ........................... 437/228 |
| 5,478,773 | 12/1995 | Dow et al. .......................... 437/60 |
| 5,518,957 | 5/1996 | Kim ................................. 437/182 |
| 5,612,254 | 3/1997 | Mu et al. .......................... 437/228 |

OTHER PUBLICATIONS

H.M. Dalal et al., "A Dual Damascene Hard Metal Capped Cu and Al–Alloy for Interconnect Wiring of ULSI Circuits", 1993 IEEE IEDM 93–273, pp. 11.4.1–11.4.4 (no month available).

Primary Examiner—Kishor Mayrkar
Attorney, Agent, or Firm—Fleshner & Kim

[57] ABSTRACT

A selective copper deposition method, comprising the steps of: forming barrier metal patterns on a wafer; and depositing copper only on the barrier metal patterns by electrochemistry, by which high pure copper film patterns can be formed simultaneously with deposition of copper, with ease.

3 Claims, 3 Drawing Sheets

SELECTIVE COPPER DEPOSITION METHOD

This application is a continuation of application Ser. No. 08/583,892 filed Jan. 11, 1996, now abandoned.

BACKGROUND OF THE INVENTION

1. Field of the invention

The present invention relates, in general, to a selective copper deposition method and, more particularly, to use of electrochemistry for copper deposition.

2. Description of the Prior Art

Most of metal wirings used in VLSI devices are made of tungsten, superior in electromigration (hereinafter referred to as "EM"), or aluminum, relatively low in electrical resistance. However, the two types of metal wirings cannot satisfy the EM and electrical resistance required for 1 giga or more DRAM. Recently, active research has been directed to copper, a promising metal.

To date, the use of wirings of copper includes a significant problem. In detail, there are not yet established standards for precursors to be used upon deposition and the deposition methods thereof, membrane quality and forming methods of pattern.

In copper-depositing methods suggested up to date, the most representative is metal-organic chemical vapor deposition (hereinafter referred to as "MOCVD"), in which organo-metals, represented by AcAc (acetylacetone R=R'=CH$_3$), hf$_{ac}$ (1,1,1,5,5,5-hexafluoroacetylacetone R=R'=CF$_3$) and tf$_{ac}$ (trifluoroacetylacetone R=CF$_3$) are utilized as precursors. However, when blanket deposition is effected by MOCVD, problems for membrane quality and subsequent pattern formation also remain unsolved.

For pattern formation, the damascene process, developed by IBM corporation, U.S.A., is one of the solutions, which will be illustrated in conjunction with FIGS. 1A to 1D in order to better understand the background of the invention.

FIG. 1A shows a wafer 1 of which the surface is deposited with, an intermetallic dielectric (hereinafter referred to as "IMD") 2, an insulating film.

On the IMD is formed photosensitive film patterns 3 which serve as a mask in subsequent photolithographic process, as shown in FIG. 1B. As a result of this etching, the insulating film is selectively removed so as to form spaced-apart patterns.

Following removal of the photosensitive film patterns 3, a blanket of copper 4 is formed over the resulting wafer by use of CVD, as shown in FIG. 1C.

Then, a chemical mechanical polishing (hereinafter referred to as "CMP") process is effected on the copper blanket, to form a wiring structure in which insulating films and copper films 4' alternate.

As for technique for the copper blanket, when copper precursors are let to enter a chamber, thermal energy is utilized to cleave copper from the precursors which is, then, deposited over the wafer 1 present in the chamber.

In as much as the copper film obtained by such MOCVD is based on the separation of copper from its precursors using thermal energy, carbon bonds in the precursors inevitably break owing to which contamination of copper occurs. Therefore, it is impossible to obtain 1.7 $\mu\Omega$cm, the resistance of pure copper.

After depositing copper, when the copper blanket thus obtained is subjected to etch to form predetermined patterns, the copper is reacted with a base etchant, e.g. BCl$_3$ or Cl$_2$, to give CuCl$_2$, a product. Since CuCl$_2$ sublimes at 200° C. or higher, the temperature of wafer must be elevated up to at least 200° C. in order to obtain desired copper patterns.

In particular, this technique is difficult to apply for highly integrated devices very dense but relatively poor in topology, such as VLSI. Copper deposition has appeared as a hot issue in manufacture of semiconductor devices.

SUMMARY OF THE INVENTION

Therefore, it is an object of the present invention to overcome the above problems encountered in prior arts and to provide a selective copper deposition method taking advantage of electrochemistry.

It is another object of the present invention to provide a selective copper deposition method by which copper patterns are formed simultaneously with deposition of copper.

It is a further object of the present invention to provide a selective copper deposition method by which copper film patterns with highly purity are accomplished.

It is still a further object of the present invention to provide a selective copper deposition method in which any etching process is not necessary.

Based on the intensive and thorough research by the present inventors, the above objects could be accomplished by a provision of a selective copper deposition method, comprising the steps of: forming barrier metal patterns on a wafer; and depositing copper only on the barrier metal patterns by electrochemistry.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE INVENTION

Figure 1A:
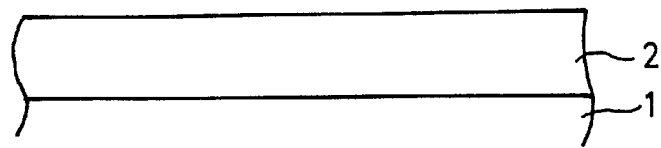
FIGS. 1A through 1D are schematic cross sectional views showing a conventional copper deposition method in which damascene process is employed.
Figure 1B:
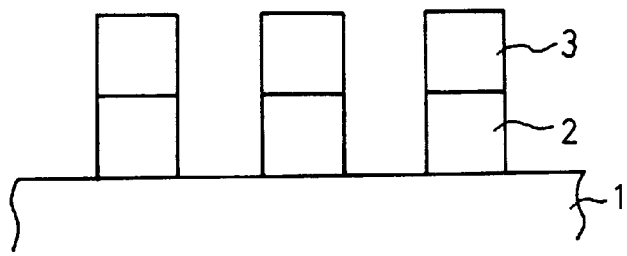
Figure 1C:
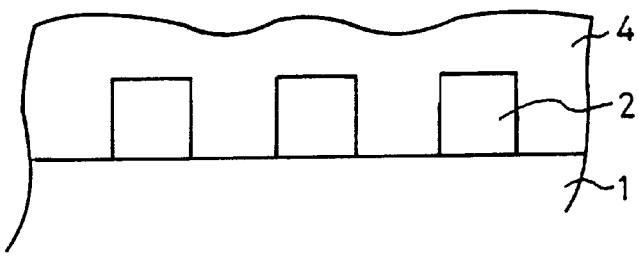
Figure 1D:
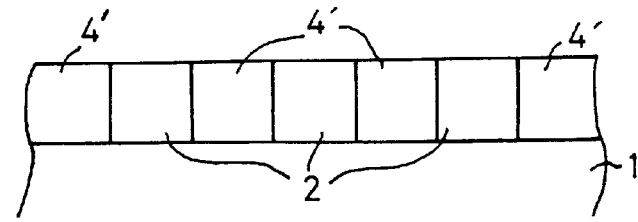

The application of the preferred embodiment of the present invention is best understood with reference to the accompanying drawings, wherein like reference numerals are used for like and corresponding parts, respectively.

The present invention is concerned with a method for selectively depositing copper in which conductors such as barrier metal is first formed and copper is deposited only on the conductors through electrochemical process, with the aim of forming copper patterns simultaneously with the copper deposition and which will be in detail described in conjunction with FIGS. 2A through 2D.

Figure 2A:
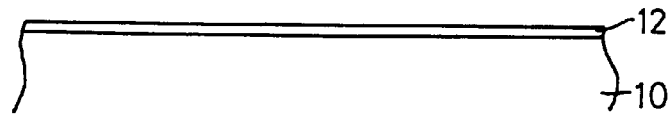
FIGS. 2A through 2D are schematic cross sectional views showing a selective copper deposition method according to the present invention.

Referring initially to FIG. 2A, there is shown a blanket of a barrier metal 12, such as TiN or TiW, over a wafer 10 in which contacts has been defined by, for example, photolithography.

Figure 2B:
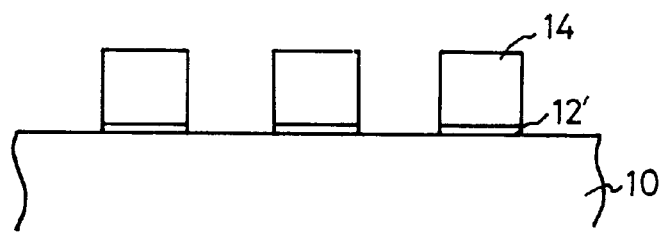

FIG. 2B is a cross section after photosensitive film patterns 14 are formed over the barrier metal 12, followed by formation of barrier metal patterns 12'. This formation can be done by, for example, etching of the barrier metal 12 with the photosensitive film patterns 14 serving as a mask.

Figure 2C:
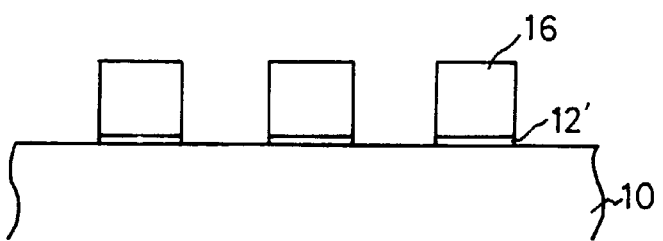

FIG. 2C is a cross section after the photosensitive film patterns 14 on the barrier metal patterns 12 are taken off, followed by electrochemical deposition of copper over the naked barrier metal patterns 12'.

Figure 3:
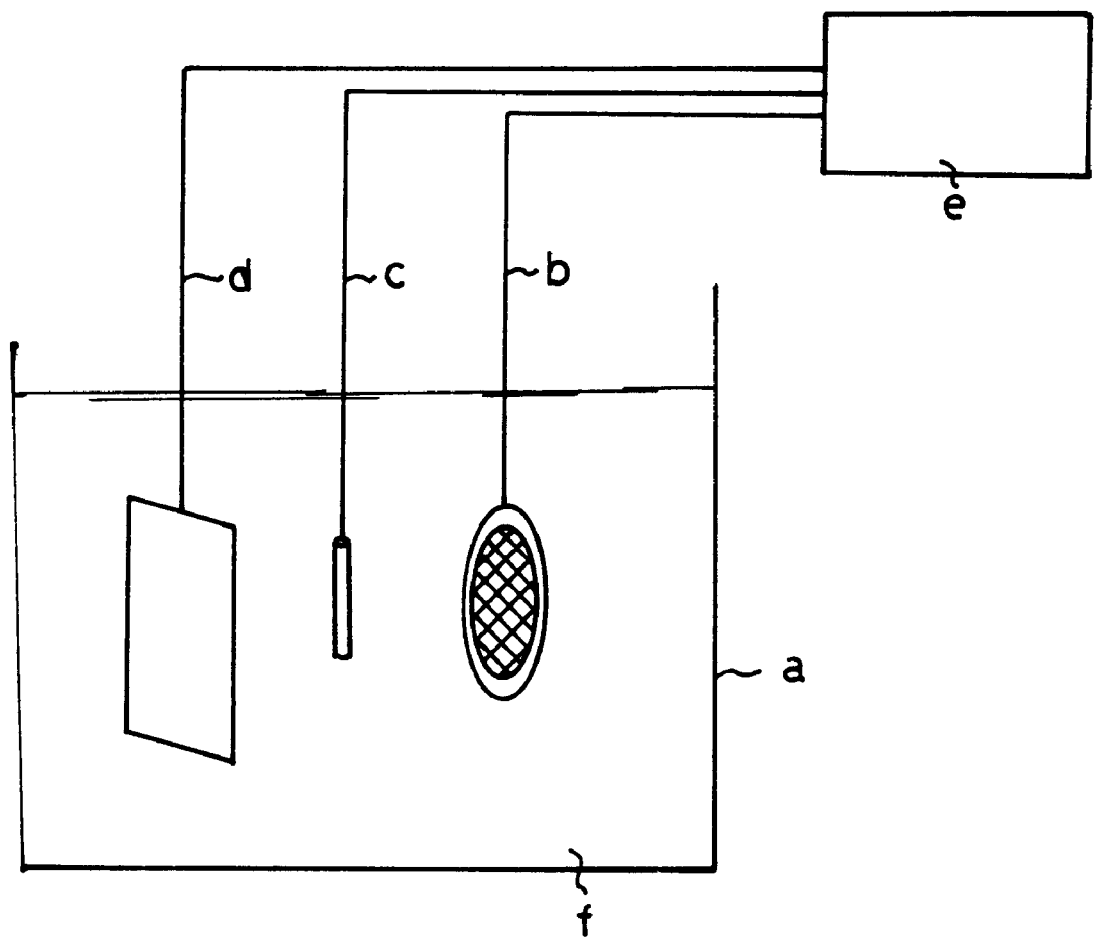
FIG. 3 is a schematic diagram showing the application of an electrochemistry according to the present invention.

The electrochemical deposition of copper is further illustrated in FIG. 3. First, the wafer is immersed in a Cu electrolyte solution f in a container a. Thereafter, the wafer is connected with a cathode b through that such as clamp, together with a reference electrode c and an anode d, all being connected with a potential meter. Here, the container a is of insulation and is formed of teflon or quartz, resistant to acid such as $H_2SO_4$.

In accordance with the present invention, a solution comprising $CUSO_4$, $H_2SO_4$ and deionized water is employed as the Cu electrolyte solution f in which $H_2SO_4$ and deionized water serve to enhance the electroconductivity of $CuSO_4$. The anode d uses a copper plate wider than the wafer. In the electrolyte solution f, the concentration of $CuSO_4$ is on the order of 10 mol or less.

Meanwhile, addition of HF in the electrolyte solution f brings about an advantage of depositing copper selectively without pre-metal cleaning.

While negative charges are supplied to the cathode b connected with the wafer, positive charges are done to the anode d carrying the copper plate.

In such electric circuit shown in FIG. 3, $Cu^{2+}$ or $Cu^+$ ions are electrically drifted and diffused from the electrolyte solution f comprising $H_2SO_4$, $CuSO_4$ and deionized water. These copper ions form into copper as suggested by the reaction formulas below:

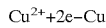
$$Cu^{2+}+2e-Cu \quad [1]$$

$$Cu^{+}+e-Cu \quad [2]$$

and it is deposited on the barrier metal patterns atop the wafer, to form a copper layer.

In order to measure a correct amount of the Cu deposited, the reference electrode c is used to control charge amount. According as the copper ions in the electrolyte solution are consumed through the reactions above, the copper plate supplies copper ions to the electrolyte solution in a reverse manner to the reaction formulas above: $Cu-Cu^{2+}+2e$, $Cu-Cu^{+}+e$. In other words, the copper plate is the source of the copper layer deposited.

On the basis of the potential of the reference electrode c the cathode b has a potential of −10 V or less. To the end the power is supplied in such a way that the absolute value of power applied for the anode d is larger than that for the cathode b by 10 V or more.

In accordance with the present invention, by virtue of the fact that Cu dissolved in the electrolyte solution f, as illustrated in FIG. 2C, is selectively deposited on the naked barrier metal patterns 12', no additional etching process is used for formation of copper patterns.

Figure 2D:
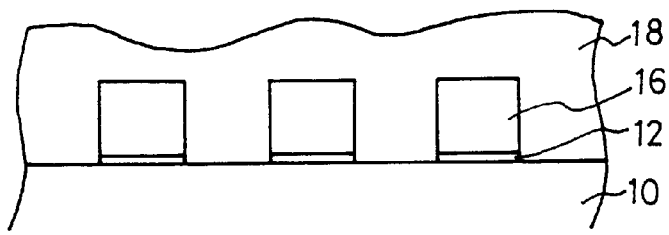

Turning now to FIG. 2D, there is shown a complete copper wiring process in which an IMD film 18 is deposited entirely over the wafer 10 on which copper 16 is deposited.

Of course, the selective copper deposition method according to the present invention can be applied for other processes than wiring processes. For example, formation of copper plug may benefice thereby, as will be described below.

First, contacts are formed in a wafer by using desired photosensitive film patterns as a mask. After removal of the photosensitive film patterns, the wafer is immersed in an electrolyte solution comprising $CUSO_4$, $H_2SO_4$, deionized water and optionally HF and then, native oxide around silicon is taken off by use of HF.

While negative charges are applied for a cathode connected with the wafer, positive charges are for an anode connected with a copper plate. Under the condition copper dissolved in the electrolyte solution is deposited on the contact hole, which results in the formation of copper plug.

As described hereinbefore, the copper fin obtained according to the present invention contains no carbon so that it shows a resistance of 1.7 $\mu\Omega$m, the resistance of pure copper. The method of the present invention by which copper is selectively deposited only over barrier metal patterns formed on a wafer has another advantage of employing no additional etching process for the copper film, aiming at simplification of procedure. By virtue of this the problems attributable to etch process do not occur per se.

Further simplification of procedure can be accomplished by adding HF in the electrolyte comprising HF. In this case, selective copper deposition can be effected without pre-metal cleaning.

The method according to the present invention can be widely applied for other copper depositions, for example, formation of copper plug in contacts.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A selective copper deposition method for forming a wiring, consisting of the steps of:
    forming barrier metal patterns on a wafer by:
        depositing a layer of a barrier metal on the wafer,
        forming photosensitive film patterns on the barrier metal,
        performing etching of the barrier metal with the photosensitive film as a mask, and
        removing the photosensitive film patterns, wherein said barrier metal patterns are formed of one selected from a group consisting of TiN or TiW;
    depositing copper only on the barrier metal patterns by electrochemistry to form the wiring without planarization by:
        immersing the wafer and a copper plate in an electrolyte solution containing copper ions, along with a reference electrode, said wafer and copper plate being connected with cathode and anode, respectively, wherein said electrolyte solution containing copper ions comprises $CuSO_4$, $H_2SO_4$, HF and deionized water, and
        applying negative and positive charges to said cathode and anode, respectively; and
    forming an intermetallic dielectric on the wafer and the wiring.

2. A selective copper deposition method in accordance with claim 1, wherein said electrolyte solution has a concentration of $CuSO_4$ not higher than 10 mol/l.

3. A selective copper deposition method in accordance with claim 1, wherein said cathode is applied with negative charges which show a potential lower than said reference electrode by 10 V.

* * * * *